Aug. 23, 1966 J. E. DEAVENPORT 3,268,738

MULTIVIBRATOR USING SEMI-CONDUCTOR PAIRS

Filed Feb. 18, 1963

INVENTOR.
JOE E. DEAVENPORT

BY Fulwider, Patton, Rieber, Lee, and Utecht

ATTORNEYS

United States Patent Office 3,268,738
Patented August 23, 1966

3,268,738
MULTIVIBRATOR USING SEMI-CONDUCTOR PAIRS
Joe E. Deavenport, 2128 Fairfield St., San Diego 10, Calif.
Filed Feb. 18, 1963, Ser. No. 259,286
16 Claims. (Cl. 307—88.5)

The present invention relates generally to multivibrators employing active devices which are alternately conducting over controllable periods of time and which may be bistable, monostable or astable in operation.

Multivibrators according to the present invention employ transistors in the active devices which are switched to be alternately conducting and each active device is preferably made up of a pair of transistors forming an NPN-PNP combination. One combination pair of transistors forming an active device switches one polarity of the supply voltage and the other combination pair forming the other active device switches the other polarity of the supply. Comparable transistors of the two active devices are oppositely biased, that is, when the transistors of one combination pair are forward biased, the transistors of the other combination pair will be reverse biased, and vice versa.

In the operation of conventional multivibrators, relatively large currents are drawn from the power supply to provide fast switching speeds, of the order of nanoseconds. In the multivibrator according to the present invention, similar very fast operation is secured with only very low current drain from the power supply. Not only is there a power saving with the same speed of operation, but inexpensive transistors can be used to provide the same fast switching speeds as presently require more expensive transistors. In the multivibrator according to the present invention, a low impedance RC circuit for the transistors supplies a very large current only during the switching time, when the capacitor is being charged and discharged through the resistor. The charging current flows for a short period of time only, and very fast switching times are secured by overdriving the transistors only during this period, so that the action consumes only a small fraction of the input power required in conventional fast multivibrators.

This fast switching time is further desirable in the astable multivibrators to square the wave output, and the astable form of the multivibrator of the present invention provides for equal rise and fall times on the square wave, as well as symmetrical on and off periods.

An advantage of the monostable form of the multivibrator according to the present invention is in the short rise and fall time of the leading and trailing edges of the output pulse and their essential similarity in shape and independence of the value of the timing capacitor.

It is therefore an object of the present invention to provide an improved multivibrator.

Another object of this invention is the provision of an improved multivibrator employing very fast switching speeds with a minimum of input power.

Another object of this invention is the provision of an improved multivibrator employing switching transistors which are overdriven with large currents only during the switching time to provide for fast operation with low power drain.

A further object of this invention is the provision of an improved multivibrator operating with very fast switching speeds but employing relatively inexpensive, low capacity transistors.

A still further object of this invention is the provision of an improved astable multivibrator having equal and very short rise and fall times on its essentially square wave output.

Yet another object of this invention is the provision of an improved astable multivibrator having substantially symmetrical on and off periods and an essentially square wave output.

A still further object of this invention is the provision of an improved monostable multivibrator in which the leading and trailing edges of the output pulse are essentially constant and have short rise and fall times independent of the value of the timing capacitor.

These and other objects and features of the invention will be readily apparent to those skilled in the art from the following specification and the appended drawing, in which.

Figure 1:
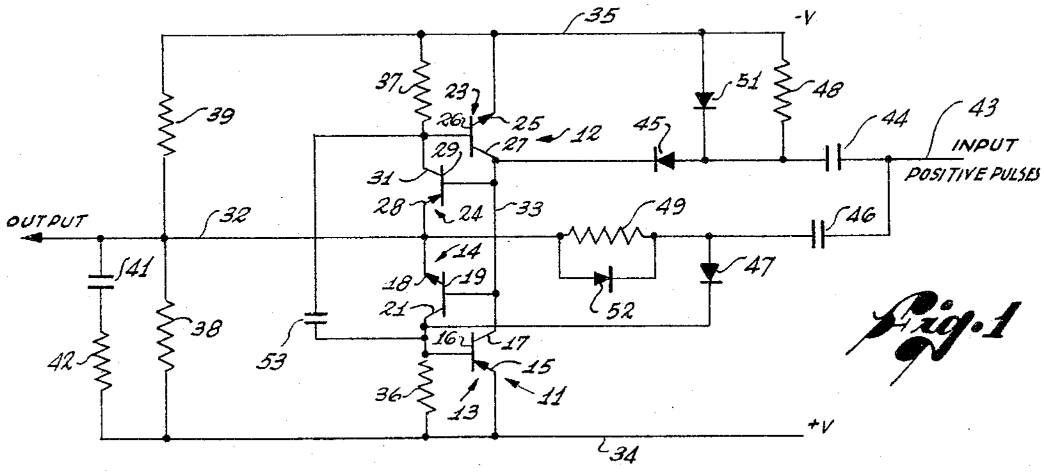
FIGURE 1 is a circuit diagram of a bistable form of multivibrator according to the present invention.

Referring first to the bistable form of the multivibrator shown in FIGURE 1, the active device of the multivibrator which switches the positive side of the supply is shown at 11, and the active device which switches the negative side of the supply at 12. The active device 11 is made up of a PNP transistor 13 and an NPN transistor 14. Transistor 13 includes an emitter 15, a base 16, and a collector 17. Transistor 14 includes an emitter 18, a base 19 and a collector 21.

The active device 12 is made up of an NPN transistor 23 and a PNP transistor 24. Transistor 23 includes an emitter 25, a base 26 and a collector 27. Transistor 24 includes an emitter 28, a base 29 and a collector 31. Emitter 18 of transistor 14 and emitter 28 of transistor 24 are connected together and to an output line 32.

Collector 17 of transistor 13, base 19 of transistor 14, base 29 of transistor 24 and collector 27 of transistor 23 are connected together by a line 33. Emitter 15 of transistor 13 is connected to the positive supply line 34. Emitter 25 of transistor 23 is connected to the negative supply line 35. The base 16 of transistor 13 and the collector 21 of transistor 14 are connected together and, through a biasing resistor 36, to the positive supply line 34. The base 26 of transistor 23 and the collector 31 of transistor 24 are connected together and, through a biasing resistor 37, to the negative supply line 35.

A resistor 38 which is large relative to biasing resistor 37 connects the positive supply line 34 to the output line 32 which connects to the emitters 18 and 28 of transistors 14 and 24. A resistor 39 which is large relative to biasing resistor 36 connects the negative supply line 35 to the output line 32. A series RC circuit provided by a capacitor 41 and a resistor 42 connects the positive supply line 34 to the output line 32, and hence to the emitters of transistors 14 and 24.

The input line for the positive pulses to operate the multivibrator to render the active devices 11 and 12 alternately conducting is shown at 43. Input line 43 is connected through a capacitor 44 and a diode 45 to the line 33 connecting the bases 19 and 29 of transistors 14 and 24. Input line 43 is also connected through a capacitor 46 and a diode 47 to the base 16 of transistor 13. A resistor 48 interconnects the negative supply line 35 to a point between capacitor 44 and diode 45. A resistor 49 connects the junction between capacitor 46 and diode 47 to the junction of emitters 18 and 28. Diodes 51 and 52 are optionally provided to shunt resistors 48 and 49, respectively, to prevent charges being built up on capacitors 44 and 46 when very fast operation is desired. A capacitor 53 is connected across the bases 16 and 26 of transistors 13 and 23 to insure that these transistors will be oppositely biased.

In describing the operation of the bistable multivibrator of FIGURE 1, it will be assumed that active device 11 is conducting, while active device 12 is non-conducting. Transistors 13 and 14 will therefore be conducting and will have a very low impedance in their emitter-collector circuits. Therefore, the emitter 18 of transistor 14 is near the voltage of the positive supply line 34, and the output at line 32 is near to +V. Current passing through transistor 14 and resistors 36 and 39, across the supply lines 34 and 35, develops a voltage across resistor 36 which forward biases the base 16 of transistor 13, whereby transistor 13 conducts to supply a forward bias to the base 19 of transistor 14, since the voltage drop across the transistor 13 is small. Transistor 14 therefore conducts and the transistors 13 and 14 remain conducting with the output at substantially +V until a positive pulse is supplied to the input line 43. Transistors 14 and 24 will always be reversely biased since they are of different type and their emitters and bases are respectively common.

With the transistor 13 conducting, its collector 17 and line 33 are substantially at +V, and the diode 45 is reverse biased through resistor 48 to the negative line 35. With such reverse bias on the diode 45, no positive input pulse can pass therethrough. With active device 11 conducting, as originally assumed, the next positive pulse will be coupled through capacitor 46 and diode 47 to the base 16 of transistor 13 and, through capacitor 53, to the base 26 of transistor 23. Diode 47 is not reverse biased under the assumed condition, since emitter 18 is substantially at the positive supply so that the diode 47 is substantially zero biased. The positive pulse, therefore, is coupled through the diode 47 in the manner stated. This pulse reverse biases the base of transistor 13 so that it ceases to conduct. With transistor 13 no longer conducting, the base 19 of transistor 14 will no longer be forward biased, and transistor 14 will also cease to conduct, so that output line 32 is disconnected from the positive supply line 34.

The pulse which reverse biased the base 16 of transistor 13 forward biases the base 26 of transistor 23 by the coupling through capacitor 53. Transistor 23 therefore conducts to forward bias the base 29 of transistor 24 which, in turn, conducts to switch the output line 32 to the negative supply line 35. Current passing through resistors 37 and 38 and transistor 24, between the supply lines, produces a voltage drop across resistor 37 which applies a forward bias to the base 26 of transistor 23 so that it remains conducting and the active device 12 conducts continuously until the next positive input pulse appears at input line 43.

Figure 2:
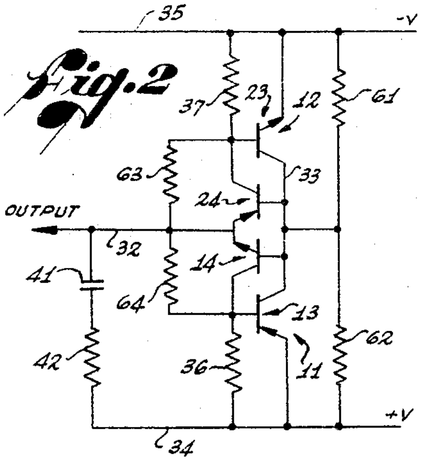
FIGURE 2 is a circuit diagram of an astable form of multivibrator according to the present invention.
Figure 3:
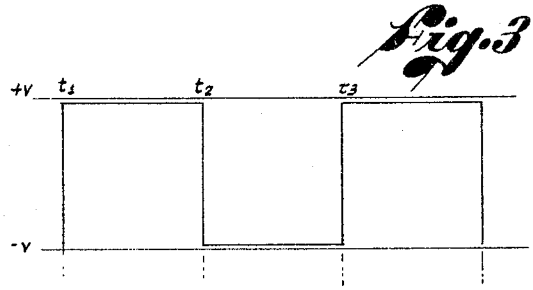
FIGURE 3 is a graph of the output pulse from the multivibrator of FIGURE 2.

Although FIGURE 3 is primarily illustrative of the operation of the astable form of multivibrator of FIGURE 2, it may also be used to illustrate, at time $t_2$, the operation of the bistable multivibrator of FIGURE 1, just described. Between times $t_1$ and $t_2$ the active device 11 is conducting to connect the output near the positive supply, and after the positive input pulse at time $t_2$, active device 12 conducts to connect the output to the negative supply line.

With active device 12 conducting and active device 11 non-conducting, the junction of the emitters 18 and 28 is substantially at —V, and the diode 47 is now reverse biased through the resistor 49 so that it will not transmit the next positive pulse from the input line 43. However, with device 12 conducting, diode 45 is no longer reverse biased, since collector 27 of transistor 23 is substantially at the negative supply potential. Therefore, diode 45 will pass the next succeeding positive pulse and it will be coupled through capacitor 44 and diode 45 to the bases 19 and 29 of transistors 14 and 24.

The second positive pulse, which occurs with active device 12 conducting, therefore reverse biases the base 29 of transistor 24 to cut it off and remove the forward bias to base 26 of transistor 23 which also becomes non-conducting so that the active device 12 is shut off. At the same time, this second positive pulse forward biases the base 19 of transistor 14 which conducts to apply a forward bias (by the voltage across resistor 36) to the base 16 of transistor 13. Conduction of transistor 13 forward biases the base 19 of transistor 14, so that both remain conducting, and the active device 11 thereby reconducts after the second positive pulse to connect the output line 32 to the positive supply line.

Successive positive pulses at the supply line 43 will effect alternate conduction of the active devices 11 and 12 in the manner described to connect the output line 32 alternately to the positive and negative supply lines 34 and 35. On the graph of FIGURE 3 this operation is represented by the switching from the negative supply line to the positive supply line at $t_1$ and from the positive supply line to the negative supply line at $t_2$.

Figure 4:
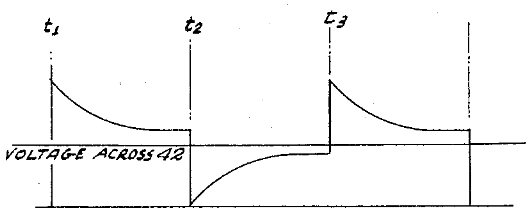
FIGURE 4 is a representation of the voltage appearing across the resistor of the RC circuit supplying the switching current.

Capacitor 41 and resistor 42 form a low impedance RC circuit which is connected to the common emitters 18 and 28 of transistors 14 and 24. This low impedance path is effective only during the switching time when one active device is being turned off and the other is being turned on. The passage of current through this RC circuit may be represented by the graph of FIGURE 4 which shows the voltage across the resistor 42 and therefore is representative of the current passing through the RC circuit. It will be seen that this current is high only at the switching time and rapidly decays according to the RC constant so that the circuit does not constitute a power drain on the supply. The transistors are overdriven only at the time of switching when the capacitor is charging and discharging so that very fast operation can be secured with inexpensive transistors which carry the overdrive current for only very short periods.

The large switching current is therefore supplied by the charging and discharging of the capacitor 41 and is a drain on the supply only during the short charging time after active device 12 becomes conducting. As an example of the increase in switching current, the normal quiescent current through transistor 14 and resistor 39, or transistor 24 and resistor 38, may be of the order of one milliampere. However, the switching current which passes through these transistors is the discharging and charging current of the capacitor 41 and may be of the order of 10 to 100 milliamps. The switching currents instantaneously overdrive the transistors to decrease the switching time a full order of magnitude, for example, from $5\times10^{-8}$ to $5\times10^{-9}$ seconds. Since the transistors will be carrying overdrive current for such a short period of time, inexpensive transistors rated for the normal quiescent current may be utilized in the circuit at a considerable saving.

As previously stated, the use of the shunting diodes 51 and 52 is entirely optional, but may be desired for very fast operation to prevent charges being built up on capacitors 44 and 47.

The astable form of multivibrator illustrated in FIGURE 2 is free-running and no synchronizing input pulses are provided for, although it is, of course, within the spirit of the invention that synchronized operation may be provided for, if desired. This multivibrator generates a periodic rectangular output wave, such as is shown in FIGURE 3. The wave periods are substantially symmetrical in the arrangement of FIGURE 2, since the time constants are substantially identical for both periods of the active devices, being determined essentially by the RC circuit of capacitor 41 and resistor 42. The components of the astable multivibrator of FIGURE 2 which are the same or similar to those of the bistable multivibrator of FIGURE 1 are given the same numerical designations. Thus the active devices continue to be numbered 11 and 12, and the transistors composing them are designated 13, 14 and 23, 24, respectively.

The input circuitry is omitted, since the astable multivibrator is shown in free-running form, and the line 33 is connected to the mid-point between a pair of resistors 61 and 62 connected in series across the supply lines 34 and 35. Resistors 38 and 39 are also omitted, and substituted therefor are similar resistors 63 and 64 which are connected between the output line 32 and the bases of transistors 23 and 13, respectively.

The operation of the astable multivibrator according to the present invention may be described as follows: assume that transistors 13 and 14 have just become conducting so that capacitor 41 will discharge through the emitter of transistor 14. This discharge current also passes through low resistance biasing resistor 36 and the voltage drop thereacross will forward bias the base of transistor 13 and will hold transistors 13 and 14 conducting until capacitor 41 discharge current has decreased to some fixed level determined by the various resistors in the circuit. While the discharge current of capacitor 41 through transistor 14 holds transistor 13 conducting, the voltage across resistor 64 is very low because of the low impedance of transistor 14 and, therefore, resistor 64 provides essentially no forward bias to transistor 13. Resistors 63 and 37 provide forward bias to transistor 23 while active device 11 is conducting (during the time from $t_1$ to $t_2$ of FIGURES 3 and 4), but the magnitude of collector current in transistor 13 will be larger than the collector current in transistor 23 until the discharge current from capacitor 41 has decreased to the small value represented by the voltage trace at $t_2$ of FIGURE 4.

At point $t_2$ the collector current in transistor 23 and the current through resistor 61 cause transistor 14 to become reverse biased and transistor 24 to become forward biased, and active device 11 ceases to conduct while device 12 becomes conducting to connect the output to the negative supply line. The emitter current of transistor 24 will now charge the capacitor 41 through resistor 42 to a new voltage, with the current decreasing according to the RC constants to a time $t_3$ when active device 12 becomes non-conducting and active device 11 reconducts to again connect the output to the positive supply. Since the charging and discharging currents for capacitor 41 are again overdriving the transistors 14 and 24, the switching times will be short, as in the case of the bistable multivibrator, and the square wave output of FIGURE 3 will have substantially equal rise and fall times of very short duration. Also, the output wave will be symmetrical in its two periods because the time constants are substantially identical for both periods.

Figure 5:
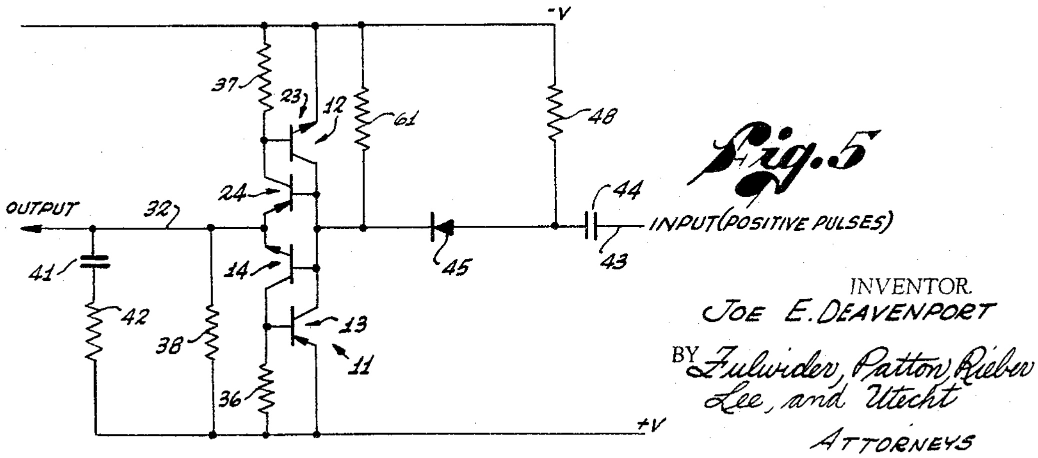
FIGURE 5 is a circuit diagram of a monostable form of multivibrator according to the present invention.

In the monostable form of multivibrator of FIGURE 5, the components which are the same as those in the multivibrators of FIGURES 1 and 2 have been given the same reference numerals. In this monostable multivibrator the static or normal condition will be when resistor 61 forward biases the base-emitter junction of transistor 24, and resistor 38 supplies an emitter load for transistor 24 and holds the pair of transistors 23, 24 in a conducting state with the active device 12, therefore, conducting.

If, when in this normal condition, an input pulse is applied to the line 43, it will be coupled through the capacitor 44 and diode 45 to the base of transistor 24 which is thereby reverse biased to become non-conducting. This same pulse forward biases the base of transistor 14 which becomes conducting. Capacitor 41 will now discharge through transistor 14 and resistor 36, and both transistors 13 and 14 are thereby forward biased and conduct for a period of time until the capacitor discharge current decays to a value which lowers the forward bias on transistor 13 until its collector current is less than the current through resistor 61. At this point the current through resistor 61 will forward bias transistor 24 and reverse bias transistor 14, and the pair of transistors forming active device 12 will become conducting and the transistors forming active device 11 will become non-conducting. The active device 12 will thereafter remain in a conducting condition until a new positive pulse is applied at the input line 43.

The period of conduction of active device 11 is determined by the RC constants of the capacitor discharge circuit and the conduction of the active devices reverses in this time period without the application of another control pulse. Thus, a typical monostable multivibrator operation is provided for, wherein active device 12 is normally conducting until an input pulse is applied, and then active device 11 conducts for a period of time determined by the circuit components and terminating automatically to return to the normal, active device 12 conducting state. This multivibrator provides the same overdrive of the transistors 14 and 24 during charging and discharging of capacitor 41 to give a very fast switching time without a constant power drain on the supply. Also, the leading and trailing edges of the output pulse are substantially the same, due to the essentially constant impedance in series with the timing capacitor and the switching transistors.

While certain preferred embodiments of the invention have been specifically illustrated and described, it will be understood that the invention is not limited thereto, as many variations will be apparent to those skilled in the art, and the invention is to be given its broadest interpretation within the terms of the following claims.

I claim:

1. A multivibrator, including:
a pair of supply points;
an output point;
a pair of active devices electrically disposed to be alternately conducting to alternately connect the outpoint to each of the pair of supply points, each of said active devices comprising a PNP transistor and a NPN transistor, one transistor of each active device connecting one supply point to the output point;
a biasing resistor connected to each said one transistor;
means connecting each said biasing resistor to the second transistor of the associated active device to supply a forward bias thereto upon the conductivity of the one transistor in the associated active device;
means connecting each second transistor to forward bias the one transistor of their respective device upon the conductivity of the second transistor in the associated active device;
means for oppositely biasing the first transistors of said active devices so that the transistors in one of the devices will alternate in conduction with the transistors of the other device; and
means for reversing the relative bias on the first transistor of one of the devices relative to the bias on the first transistor of the other device to change the conducting condition of said devices.

2. A multivibrator, including:
a pair of supply points;
an output point;
a pair of active devices each associated with an individual one of the supply points and electrically disposed to be alternately conducting to alternately connect the output point to an individual one of the pair of supply points, each of said active devices comprising a PNP transistor and an NPN transistor;
a pair of biasing resistors each associated with an individual one of the pair of active devices;
means connecting each supply point to the output point through the associated biasing resistor and one transistor of the associated active device;
means connecting each biasing resistor to supply a forward bias to the second transistor of its associated active device upon a conductivity of the one transistor in the associated active device;

means connecting each second transistor to forward bias its associated one transistor upon a conductivity in the second transistor;
a pair of second resistors each connected to an individual one of said one transistors and the output point to pass current through the individual one of said one transistors and through the associated biasing resistor;
means interconnecting the one transistors of said active devices to insure opposite biasing of the one transistors in the active devices so that they will be alternately conducting; and
means for reversing the relative bias on said one transistors to change the conducting condition of said devices.

3. A multivibrator, including:
a pair of supply points;
an output point;
a pair of active devices each associated with a different one of the supply points and each electrically disposed to be alternately conducting to alternately connect the output point to the associated one of the pair of supply points, each of said active devices including a PNP transistor and an NPN transistor where each of said transistors has a base, an emitter and a collector, the PNP transistor of one active device and the NPN transistor of the other active device having their emitters connected to the output point, each of the collectors of said emitter-connected transistors being connected in a circuit with the associated one of said supply points;
a pair of biasing resistors each connected in a different one of the circuits including the collectors of the emitter-connected transistors and the supply points;
the other transistor of each active device having its emitter connected to the associated supply point and its base connected to the collector of the one transistor in the associated active device;
means connecting the bases of the emitter-connected transistors and the collectors of the other transistors in the active devices whereby the transistors of each active device form an inter-biasing pair; and
means for alternately reversing the bias on the one transistors in the active devices to reverse the conducting condition of the devices.

4. A multivibrator, including:
a pair of supply points;
an output point;
a pair of active devices each associated with a different one of the supply points and electrically disposed to be alternately conducting to alternately connect the output point to the associated one of the pair of supply points, each of said active devices including a PNP transistor and an NPN transistor where each of said transistors has a base, an emitter and a collector, the PNP transistor of one active device and the NPN transistor of the other active device having their emitters connected to the output point;
a pair of biasing resistors each connected in a circuit with the collector of one of said emitter-connected transistors and the associated supply point;
the other transistor of each active device having its emitter connected to the associated supply point and its base connected to the collector of the associated emitter-connected transistor;
means connecting the bases of the emitter-connected transistors and the collectors of the other transistors in each active device whereby the transistors of each active device form an inter-biasing pair;
means for alternately reversing the bias on the emitter-connected transistors in the active devices to reverse the conducting condition of the devices; and
a capacitive circuit connected to said emitters of the emitter-connected transistors in both active devices to be switched by the alternate conduction of said active devices into charging and discharging conditions to increase the switching speed of said active devices.

5. A multivibrator, including:
a pair of supply points;
an output point;
a pair of active devices each associated with a different one of the supply points and electrically disposed to be alternately conducting to alternately connect the output point to the associated one of the pair of supply points, each of said active devices including a PNP transistor and an NPN transistor where each of said transistors has a base, an emitter and a collector, the PNP transistor of one active device and the NPN transistor of the other active device having their emitters connected to the output point;
a pair of resistors each connected in a circuit with the collector of an associated one of said emitter-connected transistors and the associated one of said supply points;
means connecting the emitter of the other transistor of each active device to the associated supply point of its associated transistor;
means connecting the base of the other transistor of each active device to the collector of the associated emitter-connected transistor;
means connecting the bases of the emitter-connected transistors and the collectors of the other transistors in each active device whereby the transistors of each active device form an inter-biasing pair;
means for alternately reversing the bias on the emitter-connected transistors in both active devices to reverse the conducting condition of the devices; and
a capacitive circuit connected to said emitters of said emitter-connected transistors in both active devices to be switched to charging and discharging conditions to instantaneously overdrive the transistors at the time of switching to increase the switching speed of the transistors without placing a comparable sustained load on the transistors.

6. A multivibrator, including:
a pair of supply points;
an output point;
a pair of active devices each associated with a different one of the supply points and electrically disposed to be alternately conducting to alternately connect the output point to the associated one of the pair of supply points, each of said active devices including a PNP transistor and an NPN transistor where each of said transistors has a base, an emitter and a collector, the PNP transistor of one active device and the NPN transistor of the other active device having their emitters connected to the output point;
a pair of biasing resistors each connected in a circuit with the collector of an associated one of said emitter-connected transistors and with an associated one of said supply points;
means connecting the emitter of the other transistor of each active device to the associated supply point;
means connecting the base of the other transistor in each active device to the collector of the associated transistor in the active device;
means connecting the bases of the emitter-connected transistors and the collectors of the other transistors whereby the transistors of each active device form an interbiasing pair;
means for alternately reversing the bias on the emitter-connected transistors in both active devices to reverse the conducting condition of the devices; and
a circuit including a serially connected resistor and capacitor connected to said emitters of said emitter-connected transistors alternately to charge the capacitor through one of said emitter-connected transistors during the conduction of that transistor and to discharge the capacitor through the other emitter-connected transistor during the conduction of that transistor to supply large switching currents to said transistors to increase their switching speed, the constants of said resistor-capacitor circuit being such as to overdrive the transistors and place a power drain on the supply only for short time intervals during the switching operation.

7. A multivibrator, including:
a pair of supply points;
an output point;
a pair of active devices each associated with a different one of the supply points and electrically disposed to be alternately conducting to alternately connect the output point to the associated one of a pair of supply points, each of said active devices including a PNP transistor and an NPN transistor where each of said transistors has a base, an emitter and a collector, the PNP transistor of one active device and the NPN transistor of the other active device having their emitters connected to the output point;
a pair of biasing resistors each connected in a circuit with the collector of an associated one of said emitter-connected transistors and with an associated one of said supply points;
means connecting the emitter of the other transistor of each active device to the associated supply point;
means connecting the base of the other transistor in each active device to the collector of the associated transistor in the active device;
means connecting the base of the emitter-connected transistor in each active device and the collector of the other transistor in the active device whereby the transistors of each active device form an interbiasing pair;
means for alternately reversing the bias on the emitter-connected transistors in both active devices to reverse the conducting condition of the devices;
a circuit including a serially connected resistor and capacitor connected to said common emitters of said emitter-connected transistors to charge the capacitor through one of the emitter-connected transistors during the conductivity of that transistor and to discharge the capacitor through the other emitter-connected transistor during the conductivity of that transistor to supply large switching currents to said transistors to increase their switching speed, the constants of said resistor-capacitor circuit being such as to overdrive the transistors and place a power drain on the supply for very short time intervals during the switching operation only;
a first resistor connected between said common emitters of said emitter-connected transistors and one of said supply points;
a second resistor connected between said common emitters of said emitter-connected transistors and the other supply point; and
an input circuit connnected to said common bases of said emitter-connected transistors and transmitting a pulse to said emitter-connected transistors to reverse the conduction of said active devices.

8. A multivibrator, including:
a pair of supply points;
an output point;
a pair of active devices each associated with a different one of the supply points and each electrically disposed to be alternately conducting to alternately connect the output point to the associated one of the pair of supply points, each of said active devices including a PNP transistor and an NPN transistor;
a pair of biasing resistors each connected in a circuit with one transistor of each active device and with the output point;
means connecting each said biasing resistor to the second transistor of each associated device to supply a forward bias thereto upon a conductivity of the one transistor in the associated device;
means connecting each second transistor to forward bias the one transistor of their respective device upon a conductivity of the second transistor in the associated device;
means for oppositely biasing the one transistors of said active devices so that the devices will alternatively conduct; and
a capacitive circuit connected to said one transistors of said active devices to be alternately charged and discharged therethrough as said one transistors become alternately conducting whereby to increase the switching speed of said one transistors without placing a continuous power drain on the supply.

9. A multivibrator, including:
a pair of supply points;
an output point;
a pair of active devices each associated with a different one of the supply points and each electrically disposed to be alternately conducting to alternately connect the output point to the associated one of the pair of supply points, each of said active devices including a PNP transistor and an NPN transistor;
a pair of biasing resistors;
means connecting each supply point to the output point through a different one of the biasing resistors and one transistor of each active device;
means connecting each biasing resistor to supply a forward bias to the second transistor of its associated active device upon a conductivity of the first transistor of each active device;
means connecting each second transistor to forward bias its associated one transistor upon a conductivity of the second transistor;
a pair of additional resistors each connnected to an individual one of said one transistors and said output point to provide for a passage of current through the individual one of said one transistors and through the associated biasing resistor;
means interconnecting the one transistors of said active devices to insure opposite biasing of the one transistors in the active devices so that they will be alternatively conducting; and
a capacitive circuit connected to said one transistors in the active devices to be switched thereby to charging and discharging conditions as the active devices become alternately conducting, whereby to pass large switching currents through the transistors only at the time of switching to increase the switching speed of the one transistors.

10. A multivibrator, including:
a pair of supply points;
an output point;
a pair of active devices each associated with a different one of the supply points and each electrically disposed to be alternately conducting to alternately connect the output point to the associated one of the pair of supply points, each of said active devices including a PNP transistor and an NPN transistor;
a pair of biasing resistors;
means connecting each individual supply point in a circuit with the output point, an associated one of the biasing resistors and an associated one of the transistors of each active device;
means connecting each biasing resistor to supply a forward bias to the second transistor of its associated active device upon a conductivity of the one transistor in the associated active device;
means connecting each second transistor to forward bias its associated one transistor upon the conductivity of the second transistor in the associated active device;
a first additional resistor connecting the output point to one of the supply points;
a second additional resistor connecting the other one of the supply points to the output point;

a capacitor circuit connected to said output point and said one of said supply points; and an input circuit operatively coupled to said one transistors of the active devices for passing pulses to said one transistors in the active devices to reverse the conduction of said active devices from a conductivity of a particular one of the active devices, said active devices returning automatically to the conducting condition of the particular active device in a time interval dependent upon the constants of the discharge path for said capacitive circuit.

11. A multivibrator, including:

a pair of supply points;

an output point;

a pair of active devices each associated with a different one of the supply points and electrically disposed to be alternately conducting to alternately connect the output point of the associated one of the pair of supply points, each of said active devices including a PNP transistor and an NPN transistor;

a pair of biasing resistors;

means connecting each supply point in a circuit with the output point, an associated one of the biasing resistors and one transistor of the associated active device;

means connecting each biasing resistor to supply a forward bias to the second transistor of its associated device upon a conductivity of the one transistor in the associated active device;

means connecting each second transistor to forward bias its associated one transistor upon a conductivity of the second transistor;

a pair of first additional resistors each connected across an associated one of said one transistors; and a capacitor circuit connected between the output point and a particular one of said supply points to be switched by said one transistors in the active devices to charging and discharging conditions to pass a large switching current through said transistors only at the time of switching the one transistors, the constants of said capacitor circuit and its discharge paths determining the period of conduction of each of said active devices and operating automatically to render said active devices alternately conducting to produce a substantially rectangular wave form at said output point.

12. A multivibrator, including:

a pair of supply points;

an output point;

a pair of active devices each associated with a different one of the supply points and each electrically disposed to be alternately conducting to alternately connect the output point to the associated one of the pair of supply points, each of said active devices including a PNP transistor and an NPN transistor where each transistor includes an emitter and a collector and a base, the PNP transistor of one active device and the NPN transistor of the other active device having their emitters connected to the output point;

a pair of biasing resistors each connected in a circuit with the collector of an associated one of said emitter-connected transistors and with the associated one of said supply points;

the other transistor of each device having its emitter connected to the associated supply point and its base connected to the collector of the associated one of the emitter-connected transistors;

means connecting the bases of the emitter-connected transistors and the collectors of the other transistors whereby the transistors of each active device form an inter-biasing pair;

means for reversing the bias on the transistors in both active devices to reverse the conductivity of the transistors in each active device relative to the conductivity of the transistors in the other active device;

a capacitive circuit connected between said common emitters of said emitter-connected transistors and one of said supply points to discharge the capacitor through the transistor whose collector is connected to the same supply point, and to charge the capacitor through the transistor whose collector is connected to the other supply point to supply large switching currents to said transistors to increase their switching speed, the constants of said resistor-capacitor circuit being such as to overdrive the transistors and place a power drain only for very short time intervals during the switching operation;

an input point;

means including a capacitor and a diode for coupling said input point to said bases of said emitter-connected transistors in said active devices to pass triggering pulses to said bases;

means for applying a reverse bias to said diode in one condition of conduction of said active devices;

means including a second capacitor and a second diode connecting said input point to the bases of said other transistors in said active devices; and means for reversely biasing said second diode in the alternate condition of conduction of said active devices, whereby triggering pulses are alternately coupled to the bases of said emitter-connected transistors and to the bases of said other transistors to render said active devices alternately conducting.

13. In a multivibrator, a first pair of semi-conductors a first one of which constitutes a PNP type and the other of which constitutes an NPN type, each of the semi-conductors in the first pair having a base, an emitter and a collector, each of the semi-conductors in the first pair having conductive and non-conductive states;

means connecting the base of each semi-conductor in the first pair to the collector of the other semi-conductor in the pair to provide for a simultaneous operation of the semi-conductors in the first pair in one of the conductive and non-conductive states;

a second pair of semi-conductors a first one of which constitutes a PNP type and the other of which constitutes an NPN type, each of the semi-conductors in the second pair having a base, an emitter and a collector, each of the semi-conductors in the second pair having conductive and non-conductive states;

means connecting the base of each semi-conductor in the second pair to the collector of the other semiconductor in the pair to provide for a simultaneous operation of the semi-conductors in the second pair in one of the conductive and non-conductive states;

means connecting the emitter of the PNP type of semiconductor in a particular one of the first and second pairs with the emitter of the NPN type of semi-conductor in the other pair;

a pair of supply points;

means connecting the emitter of the NPN type of semiconductor in the particular one of the first and second pairs to one of the supply points;

means connecting the emitter of the PNP semi-conductor in the other pair to the other supply point; and means connecting the base of the PNP type of semiconductor in the particular one of the first and second pairs with the base of the NPN type of semi-conductor in the other pair and cooperative with the last mentioned means to obtain a conductivity of the semi-conductors in one of the pair simultaneously with a non-conductivity of the semi-conductors in the other one of the pairs.

14. In the multivibrator set forth in claim 13, a capacitive circuit connected between the emitter of a particular one of the semi-conductors in a particular one of the pairs and the emitter of the other semi-conductor in the particular pair to provide a charging current through the semi-conductors in one of the pairs upon the switching of the semi-conductors in that one of the pairs to a state of conductivity and to provide a discharge through the semi-conductors in the other pair upon the switching of the semi-conductors in that other pair to the state of conductivity.

15. The multivibrator set forth in claim 14 wherein first and second resistors are respectively associated with the first and second pairs of semi-conductors and wherein each resistor is connected between the collector and emitter of a particular one of the transistors in each pair.

16. In the multivibrator set forth in claim 14, means connected to the base of a particular one of the semi-conductors in each pair for introducing signals to such semi-conductors to trigger the multivibrator from a state of conductivity of the semi-conductors in one pair to a state of conductivity of the semi-conductors in the other pair.

References Cited by the Examiner

UNITED STATES PATENTS

| | | | |
|---|---|---|---|
| 2,948,820 | 8/1960 | Bothwell | 307—88.5 |
| 3,003,108 | 10/1961 | Thiele | 307—88.5 |
| 3,125,694 | 3/1964 | Palthe | 307—88.5 |

OTHER REFERENCES

"The Binistor—A New Semiconductive Device," by De Wolf, Electronic Industries, August 1960, pages 84–87.

ARTHUR GAUSS, *Primary Examiner.*

JOHN W. HUCKERT, *Examiner.*

R. H. EPSTEIN, *Assistant Examiner.*